(12) United States Patent
Ollier et al.

(10) Patent No.: US 10,103,309 B2
(45) Date of Patent: Oct. 16, 2018

(54) COMBUSTION SYSTEM HAVING IMPROVED TEMPERATURE RESISTANCE

(71) Applicant: Commissariat a L'Energie Atomique et aux Energies Alternatives, Paris (FR)

(72) Inventors: Emmanuel Ollier, Grenoble (FR); Ioannis Mantzaras, Zurich (CH)

(73) Assignee: Commissariat à l'énergie atomique et aux énergies alternatives, Paris (FR)

(*) Notice: Subject to any disclaimer, the term of this patent is extended or adjusted under 35 U.S.C. 154(b) by 0 days.

(21) Appl. No.: 15/000,744

(22) Filed: Jan. 19, 2016

(65) Prior Publication Data
US 2016/0211436 A1 Jul. 21, 2016

(30) Foreign Application Priority Data
Jan. 20, 2015 (FR) .................................. 15 50451

(51) Int. Cl.
*H01L 35/30* (2006.01)
*F24S 20/20* (2018.01)
(Continued)

(52) U.S. Cl.
CPC .............. *H01L 35/30* (2013.01); *F23B 10/00* (2013.01); *F23C 3/002* (2013.01); *F23M 5/00* (2013.01);
(Continued)

(58) Field of Classification Search
CPC .................................... F23B 10/00; F24J 2/07
See application file for complete search history.

(56) References Cited

U.S. PATENT DOCUMENTS 2,429,916 A * 10/1947 Belgau .................... F22B 25/00
122/14.21
3,498,323 A * 3/1970 Rahm .................. B01J 19/0053
110/179
(Continued)

FOREIGN PATENT DOCUMENTS

FR 2 995 983 A1 3/2014
GB 1 207 275 A 9/1970
(Continued)

OTHER PUBLICATIONS

U.S. Appl. No. 14/009,959, filed Oct. 4, 2013, 2014/0166085 A1, Emmanuel Ollier.
(Continued)

*Primary Examiner* — Tae-Sik Kang
(74) *Attorney, Agent, or Firm* — Oblon, McClelland, Maier & Neustadt, L.L.P.

(57) ABSTRACT

A combustion system is provided, including at least one combustion module and at least one source of combustible gas and oxidizing gas, the combustion module including a body including a single solid piece of material including two combustion chambers configured to be supplied with the at least one combustible gas and said one oxidizing gas; a first connector in contact with a first end of the body and being heat insulating, including first supply conduits configured to supply a combustible gas to the two combustion chambers, and first evacuation conduits configured to evacuate combustion gas from the two combustion chambers; and a second connector in contact with a second end of the body and being heat insulating, including second supply conduits configured to supply a combustible gas and an oxidizing gas to the two combustion chambers, and second evacuation conduits configured to evacuate combustion gas from the two combustion chambers.

19 Claims, 4 Drawing Sheets

(51) Int. Cl.
  *F24S 20/40*  (2018.01)
  *F23M 5/00*  (2006.01)
  *F23B 10/00*  (2011.01)
  *F23C 3/00*  (2006.01)

(52) U.S. Cl.
  CPC .............. *F24S 20/20* (2018.05); *F24S 20/40* (2018.05); *Y02E 10/41* (2013.01)

(56) References Cited

U.S. PATENT DOCUMENTS

| | | | | |
|---|---|---|---|---|
| 3,963,018 | A | * | 6/1976 | Schultz .................... F24C 5/08 126/91 A |
| 4,673,348 | A | | 6/1987 | Riley et al. |
| 4,912,931 | A | * | 4/1990 | Joshi ....................... F23C 6/045 60/732 |
| 6,193,501 | B1 | | 2/2001 | Masel et al. |
| 6,786,716 | B1 | * | 9/2004 | Gardner .................. F23C 13/00 431/268 |
| 7,862,331 | B2 | | 1/2011 | Norton et al. |
| 2003/0079773 | A1 | * | 5/2003 | Salstrom ................ H02S 10/30 136/253 |
| 2006/0107995 | A1 | * | 5/2006 | Kovacik ................. H02S 10/30 136/253 |
| 2009/0220906 | A1 | * | 9/2009 | Graf v. Schweinitz ..................... F23C 3/002 432/31 |
| 2011/0229836 | A1 | * | 9/2011 | Schutz .................... F23D 14/64 431/181 |
| 2014/0230869 | A1 | | 8/2014 | Chen et al. |
| 2015/0243871 | A1 | * | 8/2015 | Ollier ...................... H01L 35/32 136/206 |

FOREIGN PATENT DOCUMENTS

| | | | |
|---|---|---|---|
| WO | WO1998012476 A1 | * | 3/1998 |
| WO | WO 2014/048992 A1 | | 4/2014 |
| WO | WO2014048992 A1 | * | 4/2014 |
| WO | WO 2014/201116 A1 | | 12/2014 |

OTHER PUBLICATIONS

U.S. Appl. No. 14/128,266, filed Feb. 25, 2014, 2014/0158334 A1, Olivier Dellea et al.
U.S. Appl. No. 14/182,659, filed Feb. 18, 2014, 2015/0274516 A1, Eric Ollier.
U.S. Appl. No. 14/378,267, filed Aug. 12, 2014, 2015/0001990 A1, Emmanuel Ollier et al.
U.S. Appl. No. 14/336,351, filed Jul. 21, 2014, 2015/0021720 A1, Eric Ollier et al.
U.S. Appl. No. 14/514,703, filed Oct. 15, 2014, 2015/0329986 A1, Eric Ollier et al.
U.S. Appl. No. 14/430,762, filed Mar. 24, 2015, 2015/0243871 A1, Emmanuel Ollier.
French Preliminary Search Report dated Sep. 7, 2015 in French Application 15 50451, filed on Jan. 20, 2015 (with English Translation of Categories of Cited Documents)
European Office Action dated Oct. 18, 2017 in European Patent Application No. 16 151 962.4.

* cited by examiner

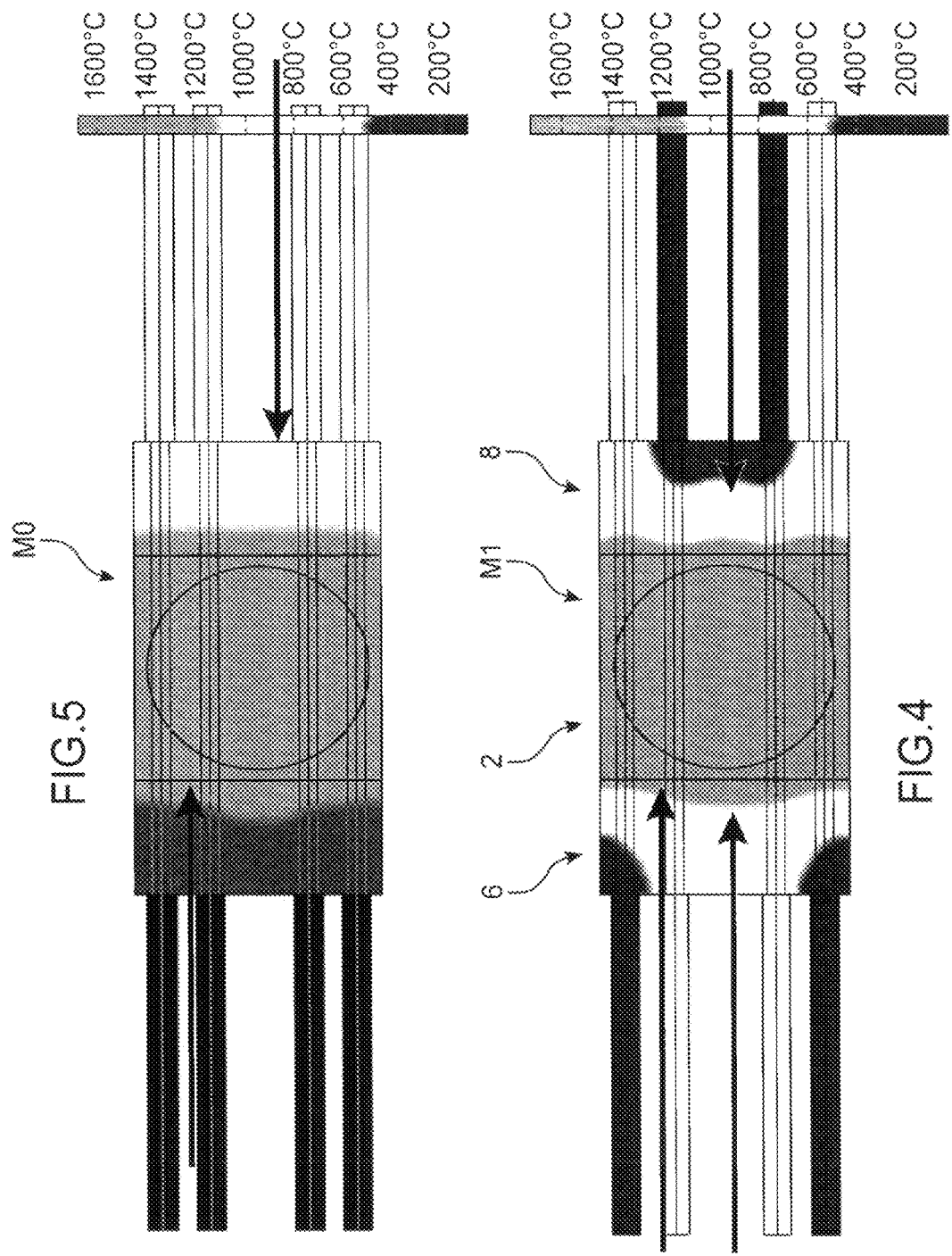

COMBUSTION SYSTEM HAVING IMPROVED TEMPERATURE RESISTANCE

TECHNICAL FIELD AND PRIOR ART

The present invention relates to a combustion system having improved temperature resistance and to a hybrid solar system comprising at least one such combustion module.

Electricity production devices exist comprising a combustion module and a thermoelectric module, the hot face of the thermoelectric module being in contact with one of the faces of the combustion module. By burning one or more gases in the combustion module, the face of the thermoelectric module in contact with the combustion module is heated, a temperature gradient appears in the thermoelectric module, there is then production of electricity.

An example of such a device is described in the document U.S. Pat. No. 7,862,331.

The combustion module comprises a chamber supplied with gas via at least one supply pipe, the combustion gases are evacuated via at least one evacuation conduit.

The material of the module has very good thermal conductivity since it is desired to use the heat produced in the module outside of the module. In this type of module, the temperature is in general of the order of 600° C. or less.

It is on the one hand desirable to reduce thermal losses from the combustion chamber to the exterior outside of the surface in contact with the thermoelectric module, since the highest possible temperature of the module is desired. Yet the supply and evacuation pipes, which are generally made of metal, more particularly steel, may be the source of significant thermal losses. In addition, there exists a very considerable thermal gradient between the temperature of supply with combustible gas and the temperature of the module.

Yet this thermal gradient generates significant thermomechanical stresses and may pose problems of thermomechanical resistance.

DESCRIPTION OF THE INVENTION

It is consequently an aim of the present invention to offer a combustion system comprising a combustion chamber of at least one combustible gas and one oxidizing gas offering improved temperature resistance.

The aforementioned aim is attained by a combustion system comprising at least one combustion module including at least one combustion chamber and one first end, at least one supply inlet and at least one evacuation outlet, and at a second end at least one supply inlet and at least one evacuation outlet, one first connector made of heat insulating material arranged at the first end and comprising at least one supply conduit and one evacuation conduit connected respectively to the supply inlet and to the evacuation outlet of the first end of the module, a second connector made of heat insulating material arranged at the second end and comprising at least one supply conduit and at least one evacuation conduit connected respectively to the supply inlet and to the evacuation outlet of the second end and at least one source of at least one combustible gas and at least one oxidizing gas, said source being connected to the supply conduits of the first and second connectors, such that each first and second connector is crossed through by at least one mixture of a combustible gas and an oxidizing gas and by a combustion gas.

Thanks to the invention, by implementing connectors made of heat insulating material, stresses at the ends of the body of the module are reduced and, by imposing a circulation both of combustible gas and oxidizer and of combustion gas in each connector, the thermal gradient within the connectors is reduced, which reduces the thermomechanical stresses imposed on the connectors and thus reduces the risk of fissures of one and/or the other of the connectors.

Advantageously, each end of the chamber comprises several supply inlets and several supply outlets as well as connectors, the inlets and outlets being spread out so that at least two outlets surround two inlets and vice versa, which makes it possible to further limit the thermal gradient in the connectors.

In other words, both the cold gas or gases intended for combustion and the hot gases stemming from combustion are made to circulate in each of the connectors, which makes it possible to reduce the thermal gradient compared to that imposed on a connector intended solely for supply in the case where the combustion chamber comprises one end only comprising supply orifices and one end only comprising orifices intended for evacuation.

The connectors are for example made of zirconium oxide or mullite or alumina and the combustion chamber(s) are for example made of SiC or steels or Inconel®.

The subject-matter of the present invention is then a combustion system comprising at least one combustion module and at least one source of at least one combustible gas and one oxidizing gas, said combustion module comprising:

a body including at least one combustion chamber intended to be supplied by the source of at least one combustible gas and one oxidizing gas, a first connector in contact with a first end of the body, said first connector being made of a material that is heat insulating relative to that of the body, the first connector including at least one conduit for supplying combustible gas and connected to the source of at least one combustible gas and one oxidizing gas, and at least one conduit for evacuating combustion gas, a second connector in contact with a second end of the body, said second connector being made of a material that is heat insulating relative to that of the body, said second connector including at least one conduit for supplying combustible gas and oxidizing gas and connected to a source of at least one combustible gas and one oxidizing gas, and at least one conduit for evacuating combustion gas.

Preferably, the first connector comprises at least two supply conduits connected to the source of at least one combustible gas and one oxidizing gas and at least two evacuation conduits, said supply conduits and said evacuation conduits being alternating, and/or the second connector comprises at least two supply conduits connected to the source of at least one combustible gas and one oxidizing gas and at least two evacuation conduits, said supply conduits and said evacuation conduits being alternating.

The combustion module advantageously comprises several combustion chambers, each combustion chamber being connected to a supply conduit of one of the first and second connectors and to an evacuation conduit of one of the second and first connectors.

The source of at least one combustible gas and one oxidizing gas may be a mixture of gases, for example $H_2$ and $O_2$ or $H_2$ and air.

For example the body is made of SiC and the connectors are made of zirconium oxide, mullite or alumina and/or the tubes connecting the source to the first and second connectors are made of high temperature steel or Ni—Co alloy.

Preferably, the combustion chamber(s) comprise at least one ignition catalyst.

In an example of embodiment, the combustion system comprises insertion means between the first connector and the body and/or between the second connector and the body.

The body may have substantially the shape of a rectangular parallelepiped including two faces of larger surfaces, connected by two lateral faces and two end faces, the at least one combustion chamber emerging in the end faces.

The subject-matter of the present invention is also a hybrid solar system comprising means for concentrating solar radiation, at least one combustion system according to the invention, the module being arranged such that concentrated radiation illuminates one face of the body and means for converting thermal energy into electricity on a face opposite to that illuminated by the concentrated solar radiation, and means for controlling combustion in the combustion module as a function of the concentrated solar radiation.

The means for concentrating solar radiation comprise for example at least one mirror or Fresnel lens.

The face illuminated by the concentrated solar flux may be functionalized by a high temperature solar absorber to enable heating by absorption of solar radiation, for example by an interferential absorber, such as $TiAlN/AlN/SiO_2$ or a nanostructured refractory material such as molybdenum, tantalum or tungsten.

For example, the conversion means comprise at least one thermophotovoltaic cell. The face opposite to that illuminated by the concentrated solar flux may be functionalized with a selective emitter such as a stack of $W/Al_2O_3$ or $Si/SiO_2$ or such as a nanostructured refractory material, such that the infrared radiation emitted is in a wavelength domain in which the thermophotovoltaic cell has its best conversion efficiency, such as molybdenum, tantalum or tungsten.

The subject-matter of the present invention is also a method of manufacturing a combustion system according to the invention, comprising the steps:

a) Manufacture of the body of the module comprising at least one combustion chamber, b) Manufacture of the first and second connectors crossed through by conduits, c) Assembly of the connectors on the body, d) Connection of the first and second connectors to the source of at least one combustible gas and one oxidizing gas.

During b) the first and second connectors are for example manufactured by injection molding of ceramic powder.

During c), the assembly of the connectors on the body may be carried out by welding or brazing.

The manufacturing method may comprise a step of depositing a catalyst in the at least one combustion chamber, for example by liquid phase impregnation or chemical vapor deposition.

BRIEF DESCRIPTION OF THE DRAWINGS

The present invention will be better understood with the help of the description that follows and the appended drawings, in which:

FIG. 4 is a top view of the system of FIG. 1 in which the temperature within the module is schematically symbolized by grey levels, FIG. 5 is a top view of a combustion system in which one end is dedicated to supply and the other end is dedicated to evacuation, in which the temperature within the module is schematically symbolized by grey levels, by way of comparison with FIG. 4.

DETAILED DESCRIPTION OF PARTICULAR EMBODIMENTS

Figure 1:
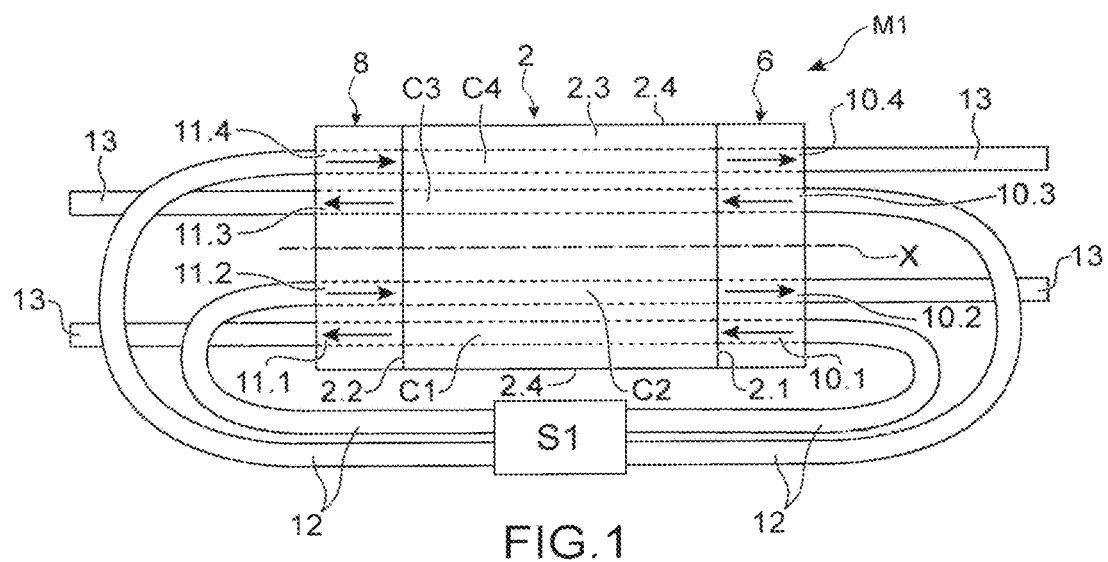
FIG. 1 is a schematically represented top view of an example of embodiment of a combustion system.

In FIG. 1 may be seen an example of combustion system comprising a combustion module M1 and a source of at least one combustion gas S1. The combustion module M1 comprises a body 2 including a plurality of combustion chambers C1, C2, C3, C4, a first connector 6 and a second connector 8.

The body 2 is advantageously one-piece, the combustion chambers being formed in the body.

The body 2 extends along a longitudinal direction X and has a first longitudinal face 2.1 or first end face 2.1 and a second longitudinal face 2.2 or second end face 2.2. In the example represented, the body has the shape of a rectangular parallelepiped. It further comprises upper and lower faces 2.3 (not visible) which have a larger surface and two lateral faces 2.4.

The combustion chambers C1, C2, C3, C4 extend parallel to a direction X.

Preferably, the combustion chambers C1, C2, C3, C4 are spread out the most towards the exterior in a transversal direction with respect to the longitudinal direction X so as to compensate lateral thermal losses and so as to assure uniform heating of the body.

In the example represented, each chamber C1, C2, C3, C4 is in the form of a channel of which a first end emerges in the first face 2.1 and of which a second end emerges in the second face 2.2. Preferably the surfaces of each combustion channel are covered with a combustion catalyst material, such as platinum.

A combustion module comprising a single combustion chamber and/or chambers having other shapes does not go beyond the scope of the present invention.

The first connector 6 comprises as many through conduits 10.1 to 10.4 as combustion chambers C1 to C4, each of the conduits 10.2 to 10.4 being intended to be aligned with one end of a combustion chamber C1 to C4.

The second connector 8 also comprises as many through conduits 11.1 to 11.4 as combustion chambers C1 to C4, each of the conduits 11.1 to 11.4 being intended to be aligned with another end of a combustion chamber C1 to C4.

In the example represented and in a preferred manner, the conduits 10.1 and 10.3 and the conduits 11.2 and 11.4 are connected to the source S1 of combustible gas and oxidizing gas. The conduits 10.2 and 10.4 and 11.1 and 11.3 are intended to evacuate the combustion gases.

In the example represented, the conduits of the connectors are connected to the same source of gas, but a system with several sources of gas, or even different gases does not go beyond the scope of the present invention. Thus each of the first 6 and second 8 connectors serves both for the supply of the chambers and for the evacuation of the chambers C1-C4.

The chambers C1 and C3 are thus supplied with gas with a view to combustion via the connector 6 through the face 2.1 of the body and the chambers C2 and C4 are supplied with gas with a view to combustion via the connector 8 through the face 2.2. The combustion gases of the chambers C1 and C3 are thus evacuated via the connector 8 and through the face 2.2 of the module and those of the chambers C2 and C4 via the connector 6 through the face 2.1.

Thus each connector 6, 8 is crossed through by combustion gases and by the combustible gas or gases and the oxidizing gas or gases which are at a temperature well below that of the combustion gas. The thermal gradient through each of the connectors is reduced compared to that of a connector serving uniquely for supply. Moreover, by alternating the supply and evacuation conduits there is better temperature homogeneity of the connector in the transversal direction, as well as in the body.

Preferably, in each connector a supply conduit alternates with an evacuation conduit, the two conduits balancing each other, which makes it possible to obtain even more homogenous temperature in the transversal direction.

Preferably, a catalyst capable of initiating combustion is present in the chambers. It is advantageously deposited on the inner surface of the combustion chambers. It may be for example constituted of platinum, rhodium or combustion catalyst oxides.

In a variant, combustion may also be initiated by an input of external energy such as for example a spark, a heating resistor. In the case of a module used in a hybrid manner which associates both solar energy and energy stemming from combustion, the energy may be simply that provided by the concentration of solar radiation on the body.

The first and second connectors are made of a heat insulating material such that they limit heat transfer from the connection module to the exterior in the direction X. The material of the first and the second connectors have a thermal conductivity substantially lower than that of the material of the body 2, advantageously at least five times lower than that of the body.

The material of the first connector may be the same as that of the second connector or a different material.

In the present application "heat insulating material" is taken to mean a material of which the thermal conductivity at room temperature is less than 50 W/m.K, preferably less than 10 W/m.K.

The heat conducting material of the body may have a thermal conductivity at room temperature greater than 30 W/m.K.

Preferably, the first and second connectors are made of zirconium oxide. In a variant it may be provided that they are made of aluminum oxide, mullite or any other material capable of assuring sufficient heat insulation.

The body is preferably made of SiC. In a variant it may be made of steel, cordierite, alloy for example nickel/cobalt.

Tubes 12 connect the source of combustible gas and oxidizer and the combustion chambers, they are connected to the conduits 10.1 and 10.3 at a first end face 6.1 of the first connector 6, the first connector 6 being connected to the body by a second end face 6.2.

In the same way, tubes 12 connect the source of combustible gas and oxidizer and the combustion chambers C1 to C4, they are connected to the conduits 11.2 and 11.4 at a first end face 8.1 of the second connector 8, the second connector being connected to the body by a second end face 8.2.

The evacuation gases are preferably collected in a reservoir or guided to the exterior via conduits 13 connected to the conduits 10.2 and 10.4 and 11.1 and 11.3 via the first faces 6.1 and 8.1 of the first and second connectors respectively.

The conduits 12 and 13 are for example made of high temperature steel, or alloy such as Ni—Co alloys. Due to the presence of heat insulating connectors interposed between the body and the combustible gas supply tubes 12, the temperature of the tubes is reduced compared to that of the combustion chambers C1 to C4 and the risks of auto-ignition are substantially reduced. The heat insulation procured by the two connectors 6, 8 is due to the heat insulating material and to the dimensions of the connectors, notably in the direction X.

Figure 2A:
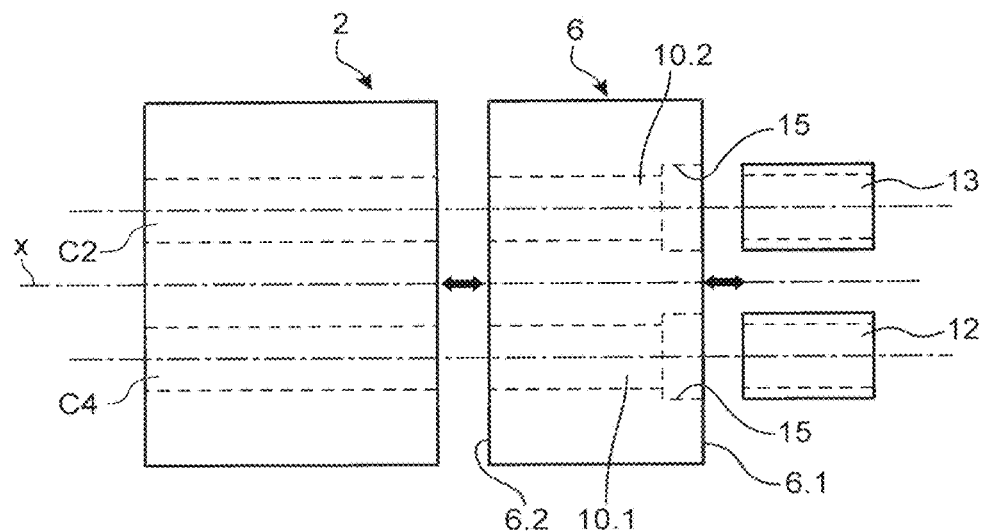
FIGS. 2A and 2B are detailed views of variants of connections at a connector, the body and supply and evacuation tubes.

In FIG. 2A may be seen a detailed view of the module of FIG. 1 at the connection between the first connector 6 and the body 2, on the one hand, and between the conduits 10.1 and 10.2 of the first connector 6 and the gas supply conduits 12 and the evacuation conduits 13, on the other hand.

In the example represented, the second end face 6.2 of the first connector 6 and the longitudinal face 2.1 of the body are in planar abutment and secured to each other so as to assure a leak tight connection between the borings 10 and the combustion chambers C1 and C2. The body 2 and the connector 6 are made integral with each other for example by welding or brazing.

Moreover in the example given, the ends of the conduits 10.1 and 10.2 emerging in the first end face 2.1 comprise a portion of larger diameter 15 making it possible to accommodate the ends of the supply tubes 12 and the ends of the evacuation tube 13.

Figure 2B:
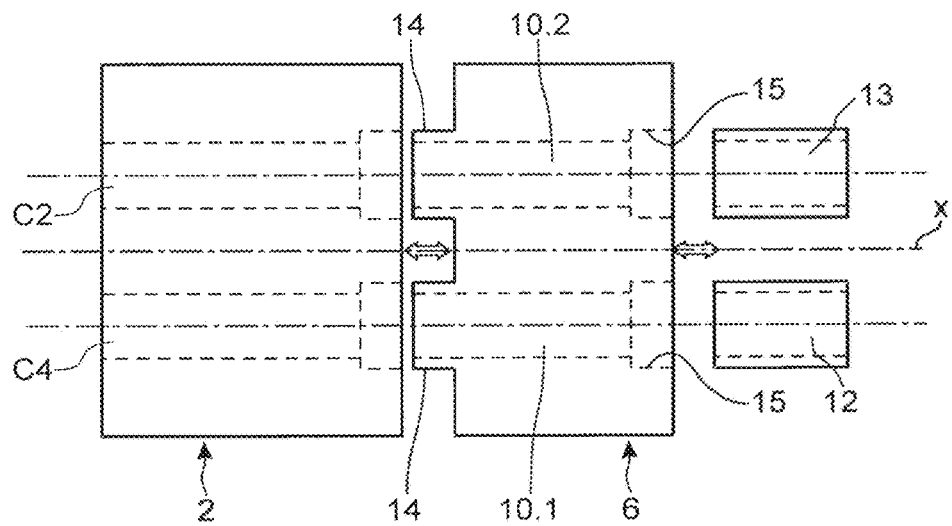

In FIG. 2B may be seen a variant of embodiment of the first connector 6 in which the second end face 6.2 comprises annular projections 14. Each annular projection 14 runs alongside one emerging end of the conduits 10.1 and 10.2 in the end face 2.2. The annular projections 14 penetrate into one end of the chambers emerging in the end face 2.1 by insertion. The end of the combustion chamber has a sufficient diameter to receive this annular projection 14. Thanks to this variant, the connection leak tightness between the first connector and the body is improved, its formation is simplified and alignment between the conduits 10.1 and 10.2 and the chambers C1 and C2 is simplified. The assembly of the materials is carried out for example by brazing.

The examples of connection between the first connector 6 and the body 2 represented in FIGS. 2A and 2B also apply to the connection between the second connector 8 and the body 2.

For example, the combustion chambers may be supplied by a $H_2$/air mixture. In a variant they may be supplied by a $H_2/O_2$ mixture. In a further variant, the combustion chambers may be supplied by a $H_2/CH_4$/air mixture, the quantity of $CH_4$ being small compared to that of $H_2$.

In a further variant, the combustion chambers may be supplied by a $CH_3OH$/air mixture. It is then preferable to preheat the intake mixture, for example to at least 200° C. This preheating may advantageously be obtained by solar energy in the case of a combustion system implemented in a hybrid solar system.

The combustible gas and the oxidizer are then mixed before being conveyed to the first and second connectors 6, 8. Advantageously, it may be provided that the conduits of the connectors intended for supply comprise means for improving the mixing of the gases, for example a porous structure.

The operation of the combustion module will now be described.

The combustion chambers C1 and C3 are supplied with gas by the tubes 12 via the conduits 10.1 and 10.3 of the first connector 6, and the combustion gases are evacuated by the tubes 13 via the conduits 11.1 and 11.3 of the second connector 8. The combustion chambers C2 and C4 are supplied with gas by the tubes 12 via the borings 11.2 and 11.4 second connector 8 and the combustion gases are evacuated by the tubes 13 via the conduits 10.2 and 10.4 of the first connector 6.

Thus each connector is both crossed through by "cold" gases coming from the exterior and hot gases coming from the combustion chambers.

Figure 3:
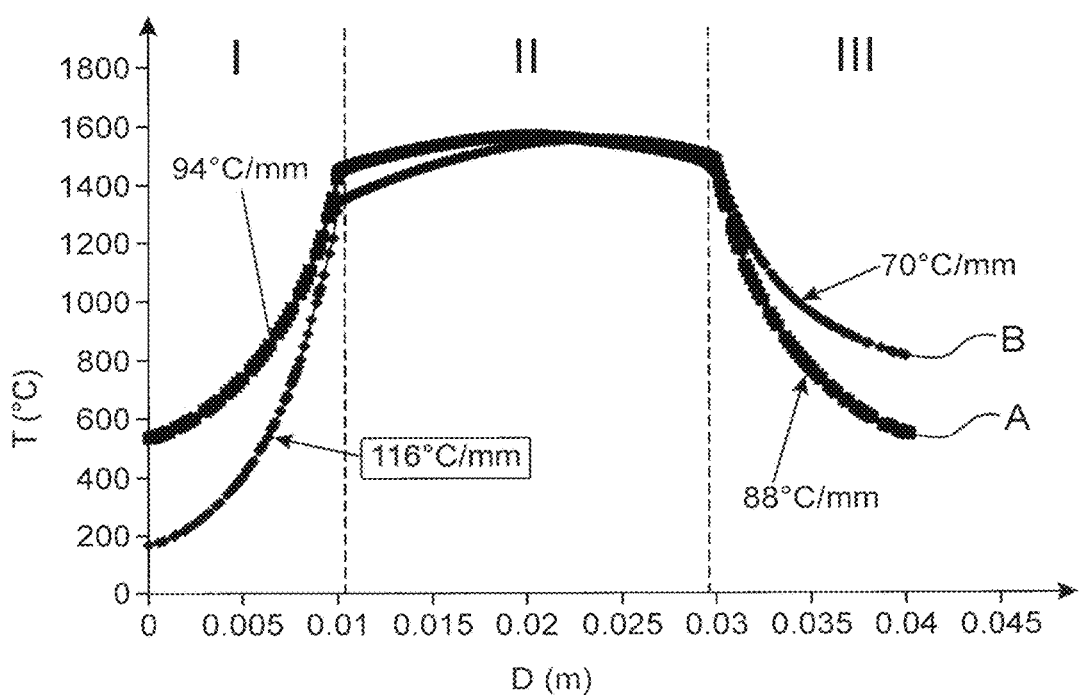
FIG. 3 is a graphic representation of the temperature variation along a longitudinal direction extending between the two connectors of the module of the system of FIG. 1 and between the two connectors of a module in which one of the connectors only serves for supply with gas.

In FIG. 3 may be seen two graphic representations of the variation in temperature T in ° C. as a function of the position in meter along the longitudinal direction X in a combustion module, the origin of the abscissa being the first end face 6.1 of the first connector 6.

Curve A is the representation of the temperature in the module M1 of FIG. 1 in which the supply and the evacuation are crossed and curve B is the representation of the temperature in a module in which the supply only takes place via a connector and the evacuation only takes place via the other connector. The first end face of the supply connector of the module of curve B is at the abscissa O.

An air and $H_2$ mixture is burned in the combustion chambers.

The two connectors are made of zirconium oxide and have a dimension in the direction X of 10 mm and the body is made of SiC and has a dimension in the direction X of 30 mm, a dimension in a transversal direction to the direction X of 30 mm and a distance between the upper face and the lower face of 5 mm. The module comprises 4 or 6 combustion chambers of 1.5 mm diameter.

Zone I corresponds substantially to the first connector 6, zone II corresponds substantially to the body 2, zone III corresponds substantially to the second connector 8.

It may firstly be noted in curve A that the variations in temperature in the first and second connectors are substantially symmetrical. In the first connector 6, the temperature increases by 94° C./mm from the first end face 6.1 to the body 2 and in the second connector 8 it increases by 88° C./mm from the first end face 8.1 to the body 2.

On the contrary in curve B, it may be noted that the temperature gradient is substantially more important in the supply connector, which only sees gas intended to be burned in the chambers, than in the evacuation connector. The temperature varies by 116° C./mm in the supply connector whereas it varies by 70° C./mm in the evacuation connector.

Thanks to the invention, the two connectors are subjected to substantially identical or very similar temperature gradients and of reduced values, which reduces the risks of damaging the connectors by thermal shock or simply resulting from thermomechanical stresses generated by the thermal gradients.

Moreover, since the two connectors have the same thermal stresses, the risks of damage within the module are reduced. The module thus offers greater thermomechanical resistance and a longer lifetime of the module and thus of the thermal system.

Moreover, it may be noted that the temperature in the body of the module of FIG. 1 is higher than that in the module with supply and evacuation via separate connectors. In fact, in the case of the module M1, the maximum temperature of the combustion module is 1756° C. and that of the lower surface 1741° C. These two temperatures are substantially greater than those of the module in which supplies and evacuations are carried out via separate connectors, for which case they are respectively 1742° C. and 1727° C. This is due to the fact that the establishment of a smaller temperature gradient between the body and connector makes it possible to limit slightly thermal losses and to obtain better temperature uniformity of the module M1.

It may also be advantageously noted that the temperature at the first end faces 6.1 and 8.1 of the first and second connectors 6, 8 respectively is less than 600° C. Yet, it is the temperature above which auto-ignition generally takes place in stoichiometric conditions. The risks of auto-ignition in the supply tubes 12 are thus reduced or even eliminated.

In FIG. 4 the main temperature zones in the module are schematically represented by grey levels. It may be seen that the body 2 of the module M1 has the highest temperature, then the two connectors 6, 8 have a relatively homogeneous temperature in the transversal direction on account of the alternating arrangement of the supply and evacuation conduits. In FIG. 5, the main temperature zones in the module M0 of curve B are represented by grey levels.

In a variant, in the first and second connectors all the supply conduits could be grouped together on one side and all the evacuation conduits could be grouped together on the other side, the module would have less good temperature homogeneity in the transversal direction but, nevertheless, the temperature gradients in the two connectors would be smaller compared to those of the connectors of the module of curve B.

In a further variant, the supply and evacuation conduits could be grouped together by groups of 2 or 3 for example, the groups being alternating.

A combustion system in which the first and second connectors are not identical, one being similar to that of FIG. 1 and the other being similar to one of the above variants, does not go beyond the scope of the present invention.

In the example of FIG. 1, the body comprises four combustion chambers. In a variant it could only comprise a single chamber with several supply inlets and several evacuation outlets spread out in the two connectors.

Preferably, at least for application to a solar system, several combustion chambers are spread out in a single plane parallel to the lower and upper faces to assure conduction of heat from the upper face to the lower face.

This combustion module may be advantageously implemented to produce a hybrid solar system in which the upper face is subjected to solar radiation and the lower face is in contact with thermoelectric modules, the heat produced by the combustion chamber making it possible to compensate variations in sunlight and to have a substantially continuous and constant operation of the thermoelectric modules. In a variant, the lower face may be positioned opposite a thermophotovoltaic cell converting the infrared radiation from the lower face into electricity.

Figure 6:
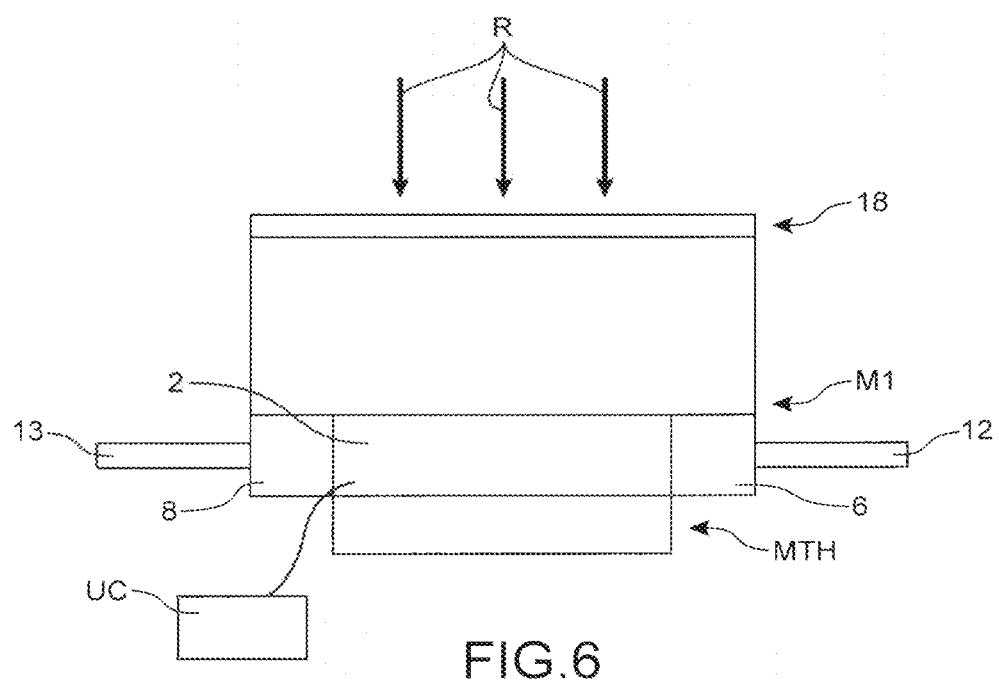
FIG. 6 is a schematic representation of a hybrid solar system implementing the combustion system.

In FIG. 6 may be seen a schematic representation of an example of a solar system comprising a combustion module according to the invention. Solar radiation is shown schematically by the arrows R.

The solar system comprises means for concentrating 18 solar radiation, a combustion module M1 arranged opposite the concentration means 18 with respect to the sun such that the upper face of the body is illuminated by the concentrated solar radiation and thermoelectric modules MTH of which the hot face is in thermal contact with the lower face of the body of the module. In a variant, this module MTH may comprise one or more thermophotovoltaic cells placed facing the lower face of the combustion module and transforming the infrared radiation into electricity.

The system comprises means for controlling UC combustion of the chamber in concentrated solar radiation operation so as to maintain a substantially constant temperature on the lower face of the body of the combustion module or to adjust the value thereof so as to control the electrical power supplied by the module.

Preferably, the upper surface of the module intended to receive the concentrated solar flux, and in particular the upper surface of the body, is functionalized with a high temperature solar absorber to enable heating by absorption of solar radiation. For example it may be an interferential absorber deposited on the upper surface, such as TiAlN/AlN/$SiO_2$ or a nanostructured refractory material such as molybdenum, tantalum or tungsten.

Preferably, the lower surface of the module, in particular the lower surface of the body, is functionalized with a selective emitter such as a stack of W/$Al_2O_3$ or Si/$SiO_2$ or such as a nanostructured refractory material such as molybdenum, tantalum or tungsten.

The lateral surfaces of the module, in particular those of the body, may advantageously be functionalized using a low emissivity material such as a refractory material.

The means for concentrating radiation are for example a mirror or Fresnel lens.

The thermoelectric modules may for example be replaced by any device capable of converting heat into electricity or any other form of energy, such as for example the aforementioned thermophotovoltaic cells.

The operation of the solar system will now be described.

When solar radiation is sufficient it heats the body of the combustion module striking its upper face after having been concentrated.

Heat is transmitted by conduction through the body up to the lower face thanks to the material of the body between the combustion chambers, a thermal gradient then appears in the thermoelectric modules and electricity is produced.

If radiation is insufficient, for example in the event of cloudy periods or at night time, gases are burned in the combustion chambers, heat is produced, which completes that produced by solar radiation or offsets its absence. A thermal gradient then appears in the thermoelectric modules and electricity is produced. In the case of a thermophotovoltaic cell replacing the thermoelectric module the infrared radiation is transformed into electricity.

An example of method of production will now be described.

The body and the first and second connectors are firstly produced by machining.

During a following step, drillings are made in the body in order to form the combustion chambers.

Then the supply and evacuation conduits 10 and 13 are drilled in the first and second connectors respectively.

In the case where the conduits could be of complex shape, the connectors may be produced by a technology of injection molding of ceramic power, more particularly micro-CIM technology to mold for example zirconium oxide, aluminum oxide, silica nitride, mullite. For example, the ceramic powder is mixed with components making it possible to inject the mixture into a mold. Then a method known as debinding makes it possible to remove from the material components other than the desired ceramic. Finally high temperature annealing makes it possible to finalize the production of the ceramic part.

During a following step, the combustion catalyst may be deposited on the inner surface of the combustion chambers by liquid impregnation or by chemical vapor deposition.

During a following step the body and the connectors are made integral for example by brazing or by welding.

During a following step, the supply and evacuation tubes are secured to the connectors for example by welding or by brazing.

It is possible to envisage securing the tubes to the connectors, before securing the connectors to the body.

As has been described above, the combustion system according to the invention is particularly suited to the production of a hybrid solar system in which the combustion chamber(s) make it possible to maintain a constant temperature with a view to thermoelectric conversion.

The combustion system may be used to generate heat on the basis of micro-combustion or meso-combustion.

Another application may be the production of combustion microsystems to obtain heat micro-sources.

Another application may be the production of combustion microsystems for micro-propulsion systems.

The invention claimed is:

1. A combustion system comprising at least one combustion module and at least one source of at least one combustible gas and one oxidizing gas, the at least one combustion module comprising:
    a body comprising a single solid piece of material including at least two combustion chambers configured to be supplied by the at least one source with the at least one combustible gas and said one oxidizing gas;
    a first connector in contact with a first end of the body, the first connector including first supply conduits configured to supply the at least one combustible gas to the at least two combustion chambers and being connected to the at least one source of the at least one combustible gas and the one oxidizing gas, and including first evacuation conduits configured to evacuate combustion gas from the at least two combustion chambers, a material of the first connector being heat-insulating relative to the single solid piece of material of the body; and
    a second connector in contact with a second end of the body, the second connector including second supply conduits configured to supply the at least one combustible gas and the one oxidizing gas to the at least two combustion chambers and being connected to the at least one source of the at least one combustible gas and the one oxidizing gas, and including second evacuation conduits configured to evacuate the combustion gas from the at least two combustion chambers, a material of the second connector being heat-insulating relative to the single solid piece of material of the body.

2. The combustion system according to claim 1,
    wherein the at least two combustion chambers are a first combustion chamber and a second combustion chamber, and the body further comprises two additional combustion chambers,
    wherein the first supply conduits are further configured to supply the at least one combustible gas to the two additional combustion chambers and are connected to the at least one source of the at least one combustible gas and the one oxidizing gas, and the first evacuation conduits are further configured to evacuate combustion gas from the two additional combustion chambers, the first supply conduits and the first evacuation conduits being disposed in an alternating arrangement, and/or
    wherein the second supply conduits are further configured to supply the at least one combustible gas to the two additional combustion chambers and are connected to the at least one source of the at least one combustible gas and the one oxidizing gas, and the second evacuation conduits are further configured to evacuate the combustion gas from the two additional combustion chambers, the second supply conduits and the second evacuation conduits being disposed in an alternating arrangement.

3. The combustion system according to claim 1, wherein the at least two combustion chambers are connected to supply conduits of at least one of the first and second connectors and to evacuation conduits of at least one of the first and second connectors.

4. The combustion system according to claim 1, wherein the at least one source of the at least one combustible gas and the one oxidizing gas is a mixture of gases.

5. The combustion system according to claim 1, wherein the at least one source of the at least one combustible gas and the one oxidizing gas is a mixture of $H_2$ and $O_2$ or $H_2$ and air.

6. The combustion system according to claim 1,
wherein the single solid piece of material of the body is SiC, and
wherein the material of the first connector and the material of the second connector are zirconium oxide, mullite, or alumina.

7. The combustion system according to claim 1, wherein the combustion system further comprises tubes connecting the at least one source to the first and second connectors, a material of the tubes being a high-temperature steel or a Ni—Co alloy.

8. The combustion system according to claim 1, wherein the at least two combustion chambers comprise at least one ignition catalyst.

9. The combustion system according to claim 1, where at least one of the first connector and the second connector further include projections on at least one end face thereof, the projections being removably insertable, respectively, into the first end of the body and the second end of the body.

10. The combustion system according to claim 1, wherein the body has a substantially rectangular parallelepiped shape including two faces of larger surfaces relative to other faces of the shape, and being connected by two lateral faces and two end faces, the at least two combustion chambers emerging at the two end faces.

11. A hybrid solar system, comprising:
a concentrator configured to concentrate solar radiation and comprising at least one mirror or a Fresnel lens;
the combustion system according to claim 1, being arranged such that concentrated solar radiation illuminates one face of the body;
a converter configured to convert thermal energy into electricity on a face of the body that is opposite to the illuminated one face; and
a controller configured to control combustion in the at least one combustion module as a function of the concentrated solar radiation.

12. The hybrid solar system according to claim 11, wherein the illuminated one face is functionalized by a high-temperature solar absorber configured for heating by absorption of solar radiation.

13. The hybrid solar system according to claim 11, wherein the illuminated one face is functionalized by an interferential absorber including at least one of TiAlN, AN, and $SiO_2$, or a nanostructured refractory material including at least one of molybdenum, tantalum, and tungsten.

14. The hybrid solar system according to claim 11,
wherein the converter comprises at least one thermophotovoltaic cell; and
wherein the face of the body that is opposite to the illuminated one face is functionalized with a selective emitter, such that emitted infrared radiation is in a wavelength domain in which the at least one thermophotovoltaic cell has a maximum conversion efficiency.

15. The hybrid solar system according to claim 11,
wherein the converter comprises at least one thermophotovoltaic cell, and
wherein the face of the body that is opposite to the illuminated one face is functionalized with a stack of tungsten and $Al_2O_3$ or of silicon and $SiO_2$, or a nanostructured refractory material including at least one of molybdenum, tantalum, and tungsten, such that emitted infrared radiation is in a wavelength domain in which the at least one thermophotovoltaic cell has a maximum conversion efficiency.

16. A method of manufacturing a combustion system according to claim 1, comprising:
a) manufacturing the body comprising the single solid piece of material including the at least two combustion chambers;
b) manufacturing the first connector and the second connector, including providing the first supply conduits, the first evacuation conduits, the second supply conduits, and the second evacuation conduits;
c) assembling the first connector and the second connector in contact with the first end of the body and the second end of the body, respectively; and
d) connecting the first connector and the second connector to the at least one source of the at least one combustible gas and the one oxidizing gas.

17. The method according to claim 16,
wherein during step b) the first and second connectors are manufactured by injection molding of ceramic powder, and/or
wherein during step c), the first and second connectors are assembled by welding or brazing.

18. The method according to claim 16, further comprising a step of depositing a catalyst in the two combustion chambers.

19. The method according to claim 18, the catalyst is deposited by liquid phase impregnation or chemical vapor deposition.

* * * * *